United States Patent
Wagatsuma et al.

(10) Patent No.: US 11,915,964 B2
(45) Date of Patent: Feb. 27, 2024

(54) SUBSTRATE PROCESSING APPARATUS AND STAGE

(71) Applicant: TOKYO ELECTRON LIMITED, Tokyo (JP)

(72) Inventors: Yuichiro Wagatsuma, Yamanashi (JP); Masahisa Watanabe, Yamanashi (JP); Mayuko Nakamura, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 380 days.

(21) Appl. No.: 17/116,799

(22) Filed: Dec. 9, 2020

(65) Prior Publication Data

US 2021/0193503 A1 Jun. 24, 2021

(30) Foreign Application Priority Data

Dec. 18, 2019 (JP) .................................. 2019-228332

(51) Int. Cl.
*H01L 21/687* (2006.01)

(52) U.S. Cl.
CPC .. *H01L 21/68742* (2013.01); *H01L 21/68785* (2013.01)

(58) Field of Classification Search
CPC ......... H01L 21/68742; H01L 21/68785; H01L 21/67103; B05C 13/00; B05C 13/02; H01J 37/32715
See application file for complete search history.

(56) References Cited

U.S. PATENT DOCUMENTS

| | | | | |
|---|---|---|---|---|
| 8,918,203 B2 * | 12/2014 | Gilchrist | ........... | H01L 21/67742 414/744.1 |
| 10,340,174 B2 * | 7/2019 | Yamaguchi | ....... | H01L 21/68742 |
| 2005/0000450 A1 * | 1/2005 | Iizuka | ............... | H01L 21/68742 118/728 |
| 2019/0027394 A1 * | 1/2019 | Sarode Vishwanath | ..................... | H01L 21/68757 |
| 2022/0013402 A1 * | 1/2022 | Verbaas | ............ | H01L 21/68742 |
| 2022/0130651 A1 * | 4/2022 | Amikura | ........... | H01L 21/68742 |
| 2022/0336258 A1 * | 10/2022 | Srivastava | ........ | H01L 21/68792 |

FOREIGN PATENT DOCUMENTS

| | | | |
|---|---|---|---|
| EP | 0777264 A1 * | 6/1997 | |
| JP | 11-111821 A | 4/1999 | |

* cited by examiner

*Primary Examiner* — Mahdi H Nejad
(74) *Attorney, Agent, or Firm* — Nath, Goldberg & Meyer; Jerald L. Meyer; Tanya E. Harkins (57) ABSTRACT

A substrate processing apparatus for processing a substrate, includes a stage including a through-hole vertically penetrating the stage, a pin inserted into the through-hole, and a support member configured to support the pin. The pin has a protrusion configured to protrude from the upper surface of the stage through the through-hole, and a large diameter portion located below the protrusion and formed thicker than the protrusion. The stage further includes a lateral hole formed to extend from a side surface of the stage so as to intersect with the through-hole. The support member is inserted into the lateral hole. The support member is configured to support the pin by an engagement with the large diameter portion while the support member is inserted into the lateral hole. An upper opening end of the through-hole is thinner than the large diameter portion.

10 Claims, 9 Drawing Sheets

SUBSTRATE PROCESSING APPARATUS AND STAGE

CROSS-REFERENCE TO RELATED APPLICATION

This application is based upon and claims the benefit of priority from Japanese Patent Application No. 2019-228332, filed on Dec. 18, 2019, the entire contents of which are incorporated herein by reference.

TECHNICAL FIELD

The present disclosure relates to a substrate processing apparatus and a stage.

BACKGROUND

Patent Document 1 discloses a substrate processing apparatus that prevents the uniformity of substrate processing from being adversely affected by circulation of a process gas or the like when a substrate is processed at a high temperature. This substrate processing apparatus has a susceptor, an elevating driving device, a plurality of substrate support pins, and a movement blocking member. The susceptor is horizontally arranged and supports the substrate so as to be placed on its upper surface. The elevating driving device elevates and drives the susceptor between a first position for supporting the substrate and a second position for waiting for support of the substrate, the second position being lower than the first position. The substrate support pins are supported so as to be vertically movable with respect to the susceptor, and supports the substrate when the susceptor is positioned at the second position. The movement blocking member blocks the substrate support pins from moving downward when the susceptor is moved from the first position to the second position. Pin insertion holes for inserting the substrate support pins are formed in the susceptor, and the diameter of the upper end of the substrate support pins is set larger than the diameter of the pin insertion holes. Thus, the substrate support pins are supported so as to be vertically movable with respect to the susceptor. In addition, a recess for accommodating the upper end of the substrate support pins having a large diameter is formed at the upper end of the pin insertion holes of the susceptor.

Prior Art Documents

[Patent Documents]
Patent Document 1: Japanese laid-open publication No. H11-111821

SUMMARY

According to one embodiment of the present disclosure, there is provided a substrate processing apparatus for processing a substrate, including: a stage including a through-hole vertically penetrating the stage, the substrate being placed on an upper surface of the stage, and at least one of heating and cooling being performed on the substrate; a substrate support pin inserted into the through-hole; and a support member configured to support the substrate support pin, wherein the substrate support pin has a protrusion configured to protrude from the upper surface of the stage through the through-hole of the stage, and a large diameter portion located below the protrusion and formed thicker than the protrusion, and the stage further includes a lateral hole formed to extend from a side surface of the stage so as to intersect with the through-hole, and wherein the support member is inserted into the lateral hole, the support member is configured to support the substrate support pin by an engagement with the large diameter portion of the substrate support pin while the support member is inserted into the lateral hole of the stage, and an upper opening end of the through-hole of the stage is thinner than the large diameter portion of the substrate support pin.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

For example, in manufacturing processes of a semiconductor device, substrate processing such as a film forming process is performed on a substrate such as a semiconductor wafer (hereinafter, referred to as a "wafer"). This substrate processing is performed using a substrate processing apparatus. When the substrate processing apparatus is a single-wafer-type substrate processing apparatus capable of processing substrates one by one, a stage on which the substrates are placed on its upper surface is provided in the apparatus. Further, in the single-wafer-type substrate processing apparatus, substrate support pins to be inserted into holes formed in the stage are provided in order to transfer the substrates between a substrate transfer device for transferring the substrates and the stage. For example, the substrate support pins are fixed to the bottom wall of a process vessel accommodating the substrates, and the stage is configured to be vertically movable. With this configuration, since the substrate support pins can vertically move relative to the stage, the substrates can be transferred between the substrate transfer device and the stage.

During the substrate processing, the substrates placed on the stage may be heated or cooled through the stage. In this case, when the substrate support pins are fixed to the bottom wall of the process vessel as described above, a positional deviation occurs between the holes of the stage and the substrate supporting pins due to thermal expansion and contraction of the stage. If the positional deviation occurs, the substrate support pins may be damaged when the substrate support pins and the stage are moved up and down relative to each other to transfer the substrates. Therefore, in Patent Document 1, the substrate support pins are supported so as to be vertically movable with respect to the susceptor by setting the diameter of the upper end of the substrate support pins larger than the diameter of the pin insertion holes of the susceptor without fixing the substrate support pins to the bottom wall of the process vessel.

However, if the diameter of the upper end of the substrate support pins is set larger, a recess whose diameter is larger than the upper end is required to be provided on the upper surface of the stage in order to accommodate the upper end. If such a recess is provided, in-plane uniformity of the temperature of the substrates on the stage is impaired.

Therefore, the technique according to the present disclosure improves the in-plane uniformity of the temperature of the substrates when the substrates placed on the stage having through-holes into which the substrate support pins are inserted to be penetrated are heated or cooled on the stage.

A substrate processing apparatus and a substrate transfer method according to the present embodiment will now be described with reference to the drawings. Further, in the present disclosure and the drawings, elements having substantially like functional components are denoted by like reference numerals and a repeated description thereof will be omitted.

Figure 1:
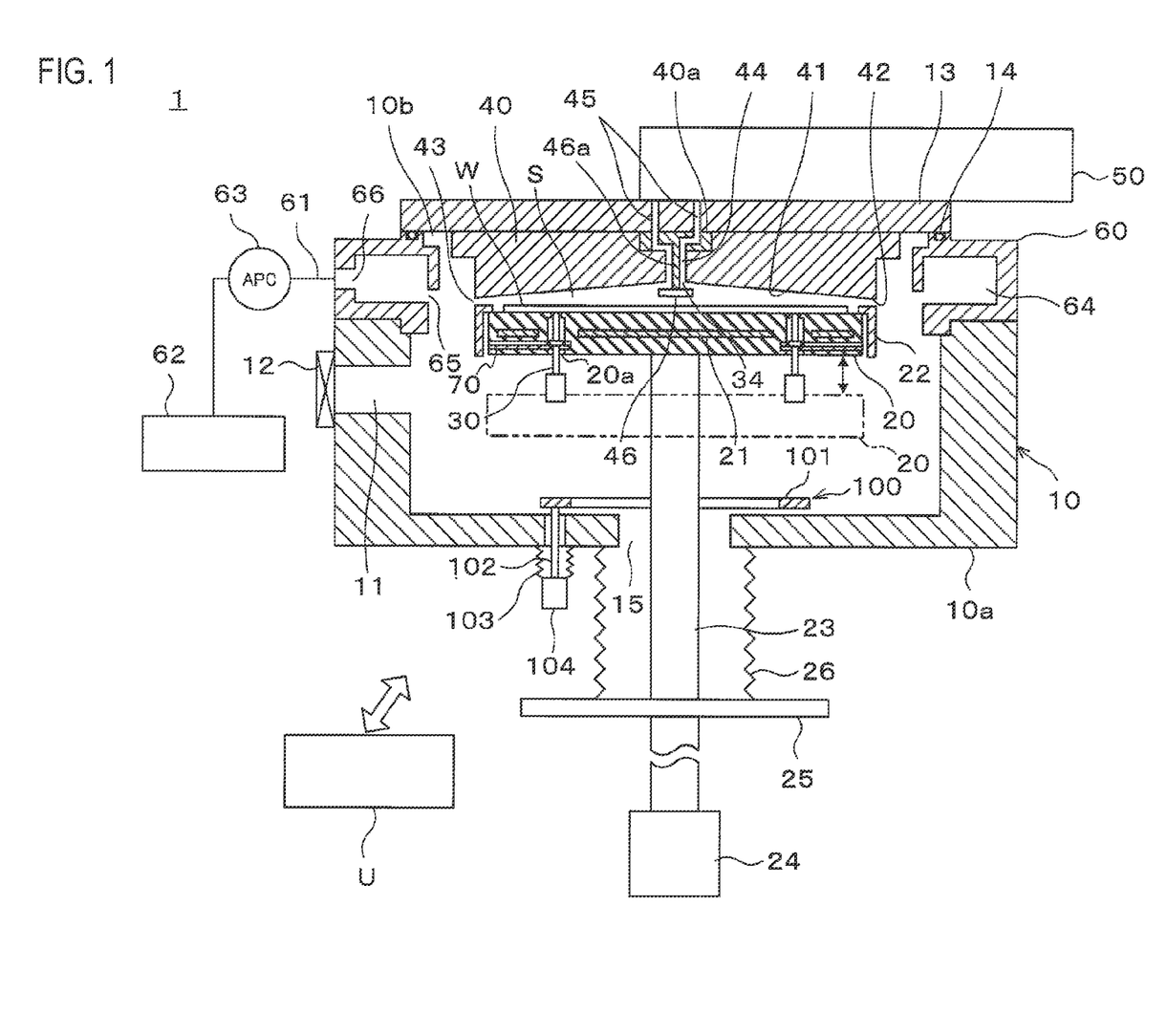
FIG. 1 is an explanatory view schematically illustrating an outline of a configuration of a film forming apparatus as a substrate processing apparatus according to an embodiment of the present disclosure, in which a portion of the film forming apparatus is shown in cross section.

FIG. 1 is an explanatory view schematically illustrating an outline of a configuration of a film forming apparatus as the substrate processing apparatus according to the present embodiment, in which a portion of the film forming apparatus is shown in cross section. The film forming apparatus 1 in FIG. 1 has a process vessel 10 configured to be depressurized and accommodating a water W as a substrate.

The process vessel 10 has a vessel body 10a having a bottomed cylindrical shape. A loading/unloading port 11 for the wafer W is provided on a sidewall of the vessel body 10a, and a gate valve 12 for opening and closing the loading/unloading port 11 is provided in the loading/unloading port 11. An exhaust duct 60 as described later, which forms a portion of the sidewall of the vessel body 10a, is provided on an upper side of the loading/unloading port 11. An opening 10b is provided in the upper portion of the vessel body 10a, specifically, in the exhaust duct 60, and a lid 13 is provided so as to close the opening 10b. An O-ring 14 for keeping the interior of the process vessel 10 airtight is provided between the exhaust duct 60 and the lid 13.

A stage 20 on which the wafer W is horizontally placed on its upper surface is provided in the process vessel 10. A heater pattern 21 as a temperature adjustment mechanism is formed inside the stage 20. The heater pattern 21 serves to heat the water W. Furthermore, when the wafer W is cooled on the stage 20, a cooling mechanism having, for example, a flow passage for a cooling medium, instead of the heater pattern 21, is provided as the temperature adjustment mechanism. Both the heater pattern 21 and the cooling mechanism may be provided inside the stage 20 such that both the heating and cooling of the wafer W can be performed. A cover member 22 is provided in the stage 20 so as to cover a region on the outer peripheral side of the placing region of the wafer W on the upper surface and its side peripheral surface in the circumferential direction.

An upper end of a support shaft member 23, which is a table support member vertically extending through the opening 15 formed through the bottom wall of the process vessel 10 and penetrating the bottom wall, is connected to the center of the lower surface of the stage 20. A lower end of the support shaft member 23 is connected to the driving mechanism 24. The driving mechanism 24 generates a driving force for moving the support shaft member 23 up and down and rotating the same, and has, for example, an air cylinder (not shown) or a motor (not shown). As the support shaft member 23 moves up and down by the driving of the driving mechanism 24, the stage 20 can move up and down between a transfer position indicated by a chain double-dashed line and a processing position above it. The aforementioned transfer position refers to a position at which the stage 20 stands by while the wafer W is transferred between a wafer transfer device M (see FIG. 5) as a substrate transfer device that enters the process vessel 10 from the loading/unloading port 11 of the process vessel 10 and lift pins 30 as described later. In addition, the aforementioned processing position refers to a position at which the film forming process is performed on the wafer W. Furthermore, as the support shaft member 23 rotates about its axis by driving the driving mechanism 24, the stage 20 rotates about the axis.

In addition, a flange 25 having a diameter larger than that of the support shaft member 23 is provided outside the process vessel 10 in the support shaft member 23. Furthermore, a bellows 26 is provided between the flange 25 and the penetrating portion of the support shaft member 23 in the bottom wall of the process vessel 10 so as to surround the outer peripheral portion of the support shaft member 23. Thus, the airtightness of the process vessel 10 is maintained.

In addition, a plurality of through-holes 20a vertically penetrating are formed in the stage 20. Furthermore, the lift pins 30 as the substrate support pins inserted into the through-holes 20a to be penetrated from below are provided in the stage 20. The lift pins 30 serve to transfer the wafer W between the wafer transfer device M (see FIG. 5) inserted into the process vessel 10 from the outside of the process vessel 10 and the stage 20. The lift pins 30 are configured to protrude from the upper surface of the stage 20 at the aforementioned transfer position through the through-holes 20a. Furthermore, the lift pins 30 are provided for the respective through-holes 20a. The shape of the lift pins 30, the support structure of the lift pins 30, and the structure for raising and lowering the lift pins 30 will be described later.

In addition, a cap member 40 for forming a processing space S is provided so as to face the stage 20 between the stage 20 and the lid 13 in the process vessel 10. The cap member 40 is fixed by the lid 13 and a bolt (not shown). An inverted bowl-shaped recess 41 is formed at the lower portion of the cap member 40. A flat rim 42 is formed outside the recess 41. Furthermore, the processing space S is formed by the upper surface of the stage 20 located at the aforementioned processing position and the recess 41 of the cap member 40. The height of the stage 20 when the processing space S is formed is set such that a gap 43 is formed between the lower surface of the rim 42 of the cap member 40 and the upper surface of the cover member 22. For example, the recess 41 is formed so that the volume of the processing space S is minimized and gas substitutability when the processing gas is substituted by a purge gas is improved.

A gas introduction passage 44 for introducing a processing gas or a purge gas into the processing space S is formed at the center of the cap member 40. The gas introduction passage 44 is provided to penetrate the center of the cap member 40 so that the lower end thereof faces the center of the wafer W on the stage 20. In addition, a flow passage forming member 40a is fitted in the center of the cap member 40. The upper side of the gas introduction passage 44 is branched by the flow passage forming member 40a to communicate with the gas introduction passage 45 penetrating the lid 13. A dispersion plate 46 for dispersing a gas discharged from the gas introduction passage 44 into the processing space S is provided below the lower end of the gas introduction passage 44 of the cap member 40. The dispersion plate 46 is fixed to the cap member 40 through a support rod 46a.

A gas introduction mechanism 50 configured to introduce a $TiCl_4$ gas, an $NH_3$ gas, a $N_2$ gas for purging, or the like as the processing gas into the process vessel 10 from a gas supply source (not shown) is provided in the gas introduction passage 45. An O-ring (not shown) for keeping the interior of the process vessel 10 airtight is provided between the gas introduction mechanism 50 and the process vessel 10, specifically, between the gas introduction mechanism 50 and the lid 13.

Furthermore, one end of an exhaust pipe 61 is connected to the exhaust duct 60 of the vessel body 10a. The other end of the exhaust pipe 61 is connected to an exhaust device 62 configured by, for example, a vacuum pump. In addition, an APC valve 63 for adjusting the internal pressure of the processing space S is provided in the exhaust pipe 61 at the upstream side of the exhaust device 62.

Furthermore, the exhaust duct 60 is formed by annularly forming a gas passage 64 having a square vertical cross section shape. A slit 65 is formed over the whole circumference on the inner peripheral surface of the exhaust duct 60. An exhaust port 66 is provided on an outer wall of the exhaust duct 60, and the exhaust pipe 61 is connected to the exhaust port 66. The slit 65 is formed at a position corresponding to the aforementioned gap 43 formed when the stage 20 rises to the aforementioned processing position. Therefore, the gas in the processing space S reaches the gas passage 64 of the exhaust duct 60 through the gap 43 and the slit 65 by activating the exhaust device 62 and is discharged through the exhaust pipe 61.

A controller U is provided in the film forming apparatus 1 configured as described above. The controller U is configured as a computer including, for example, a CPU, a memory and the like, and has a program storage part (not shown). A program for realizing wafer processing, which will be described later, in the film forming apparatus 1, or the like is stored in the program storage part. The program has been stored in a computer-readable non-transitory storage medium and may be provided in the controller U from the storage medium. Furthermore, a portion or all of the program may be realized by a dedicated hardware (circuit board).

Figure 2:
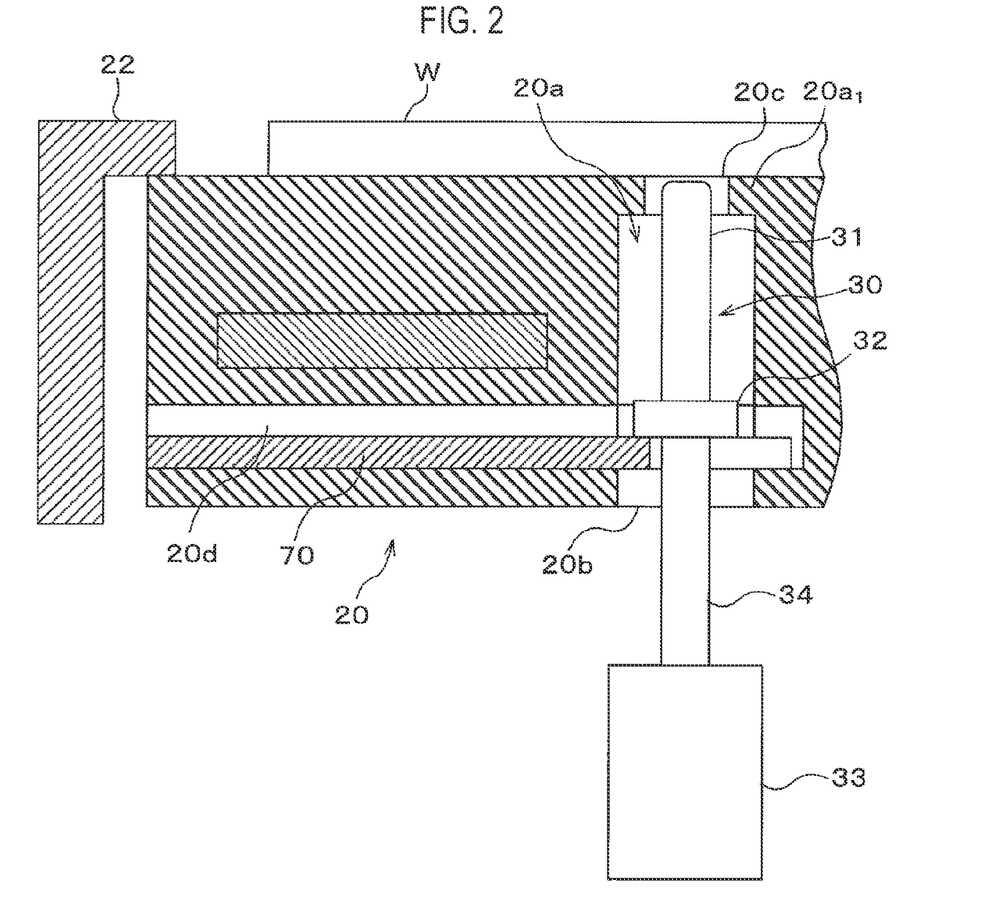
FIG. 2 is a partial enlarged view of FIG. 1.
Figure 3:
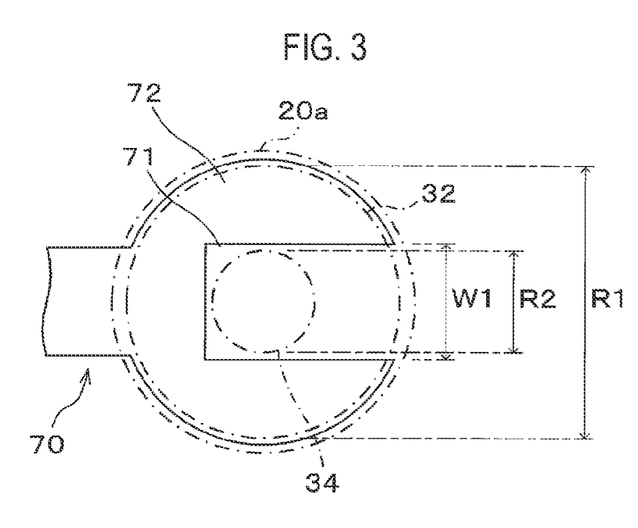
FIG. 3 is an enlarged plan view of a leading end of a support member.

Next, the shape of the lift pins 30, the support structure of the lift pins 30, and the structure for raising and lowering the lift pins 30 will be described with reference to FIGS. 1, 2 and 3. FIG. 2 is a partial enlarged view of FIG. 1. FIG. 3 is an enlarged plan view of a leading end of a support member 70 as described later.

As illustrated in FIG. 2, the lift pin 30 has a protrusion 31 configured to protrude from the upper surface of the stage 20 through the through-hole 20a of the stage 20, and a large diameter portion 32 located below the protrusion 31 and formed thicker than the protrusion 31. The large diameter portion 32 is formed thicker than the nearby-portions of the large diameter portion 32, in other words, is formed in a flange shape. The large diameter portion 32 is formed at the substantially center of the lift pin 30. Furthermore, the lift pin 30 has a contact portion 33 below the large diameter portion 32, specifically, at the lower end of the pin. The contact portion 33 is formed thicker than the large diameter portion 32, and is brought into contact with a pin movement mechanism 100 as described later. In addition, in the lift pin 30, the large diameter portion 32 and the contact portion 33 are connected by a connection portion 34, and the thickness of the connection portion 34 is substantially equal to that of the protrusion 31. Furthermore, in the present embodiment, the protrusion 31, the large diameter portion 32, the contact portion 33, and the connection portion 34 are all formed in a circular shape in cross section.

The lift pin 30 having the aforementioned respective parts is inserted into the through-hole 20a of the stage 20 from below, at least at a portion above a portion at which the large diameter portion 32 is formed. Therefore, a lower opening end 20b of the through-hole 20a is formed thicker than the large diameter portion 32 of the lift pin 30. On the other hand, an upper opening end 20c of the through-hole 20a is formed thinner than the large diameter portion 32 of the lift pin 30. Hereinafter, a portion of the upper portion of the through-hole 20a formed thinner than the large diameter portion 32 of the lift pin 30 will be referred to as a small-diameter portion $20a_1$. In addition, the through-hole 20a is formed thicker than the large diameter portion 32 of the lift pin 30, except for the small-diameter portion $20a_1$ described above, so that the protrusion 31 of the lift pin 30 can protrude or retracted above/below the upper surface of the stage 20 by vertical movement of the lift pin 30.

The support member 70 is provided inside the stage 20 in order to support the lift pin 30 inserted into the through-hole 20a. Specifically, a lateral hole 20d is formed in the stage 20 to horizontally extend from the side surface of the stage 20 so as to intersect with the through-hole 20a, and the support member 70 is inserted into the lateral hole 20d. The lateral hole 20d is provided for each through-hole 20a. An opening end of the lateral hole 20d is covered with the cover member 22.

The support member 70 supports the lift pin 30 by engagement with the large diameter portion 32 of the lift pin 30 while it is inserted into the lateral hole 20d of the stage 20. Specifically, the support member 70 suspends the lift pin 30 by contact engagement between the upper surface of the leading end of the support member 70 and the lower surface of the large diameter portion 32 of the lift pin 30 while it is inserted into the lateral hole 20d of the stage 20. The support member 70 suspends the lift pin 30 as described above at least while the stage 20 is moved to the aforementioned processing position.

While the stage 20 is in the processing position, namely while the lift pin 30 is suspended by the support member 70, the formation position of the lateral hole 20d in the height direction and the length of the protrusion 31 of the lift pin 30 are set so as to satisfy the following condition A:

(A) The upper end surface of the protrusion 31 of the lift pin 30 does not protrude from the upper surface of the stage 20 (for example, the upper end surface of the protrusion 31 is located 0.1 to 0.3 mm below the upper surface of the stage 20).

Furthermore, as illustrated in FIG. 3, a notch 71 is formed at the leading end of the support member 70, and a U-shaped engagement portion 72 in which the lift pin 30 is engaged with the notch 71 is formed. The notch 71 is cut in the insertion direction of the support member 70 into the lateral hole 20d of the stage 20. A width W1 of the notch 71 is smaller than a diameter R1 of the large diameter portion 32 of the lift pin 30 and larger than a diameter R2 of the connection portion 34 of the lift pin 30. Therefore, when the support member 70 is inserted to the inner side of the lateral hole 20d of the stage 20, the insertion is not hindered by the lift pin 30 in the through-hole 20a, and the lift pin 30 can be supported by the substantially entire engagement portion 72 of the support member 70.

The lift pin 30 and the support member 70 described above are made of, for example, alumina or aluminum nitride.

In addition, as illustrated in FIG. 1, the pin movement mechanism 100 configured to support the lift pin 30 and to vertically move the supported lift pin 30 is provided for the lift pin 30. The pin movement mechanism 100 is provided between the stage 20 and the bottom wall of the process vessel 10.

The pin movement mechanism 100 supports the lift pin 30 by engagement with the lift pin 30. Specifically, the pin movement mechanism 100 has a contact member 101, and supports the lift pin 30 by bringing the lower end surface of the contact portion 33 of the lift pin 30 that is not inserted into the through-hole 20a of the stage 20 into contact with the upper surface of the contact member 101. The contact member 101 is formed of, for example, an annular member in plan view.

A support pillar 102 is provided on the lower surface side of the contact member 101, and the support pillar 102, which penetrates the bottom wall of the process vessel 10, is connected to a driving mechanism 104 provided outside the process vessel 10. The driving mechanism 104 generates a driving force for moving the support pillar 102 up and down, and has, for example, an air cylinder (not shown). As the support pillar 102 moves up and down by the driving of the driving mechanism 104, the contact member 101 moves up and down, whereby the lift pin 30 supported by the contact member 101 moves up and down independent of the stage 20. In particular, the lift pin 30 moves upward as the support pillar 102 moves upward by the driving of the driving mechanism 104, and the upper end of the lift pin 30 protrudes from the upper surface of the stage 20 having moved to the aforementioned transfer position.

In addition, a bellows 103 is provided between the driving mechanism 104 and the penetration portion of the support pillar 102 on the bottom wall of the process vessel 10 so as to surround the outer peripheral portion of the support pillar 102. Thus, the airtightness of the process vessel 10 is maintained.

In the present disclosure, the dimensions of the stage 20 and the lift pin 30 will be described. If the diameter of the wafer W is 300 mm, the diameter of the stage 20 is, for example, 330 mm to 350 mm, and the through-hole 20a is formed at a position of 20 to 40 mm from the peripheral end of the stage 20. The upper opening end 20c of the through-hole 20a is formed thinner than the large diameter portion 32 of the lift pin 30 as described above. Specifically, for example, the diameter of the protrusion 31 of the lift pin 30 is 1 to 3 mm and the diameter of the large diameter portion 32 is twice or more it, while the inner diameter of the upper opening end 20c of the through-hole 20a is set to 1.2 to 1.5 times the diameter of the protrusion 31, for example, 1.2 to 4.5 mm. As the inner diameter of the opening end 20c is set smaller, the in-plane uniformity of the temperature of the wafer W on the stage 20 can be improved. Furthermore, the inner diameter of the lower opening end 20b of the through-hole 20a is, for example, 7 to 10 mm.

Figure 4:
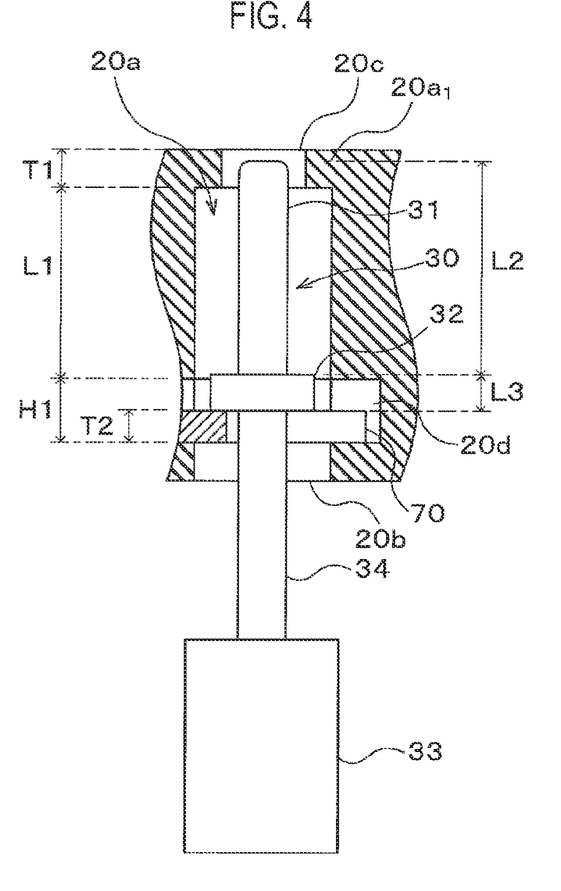
FIG. 4 is an enlarged view of neighborhood of a through-hole of a stage.

The dimensions of the stage 20 and the lift pin 30 will be further described with reference to FIG. 4. FIG. 4 is an enlarged view of neighborhood of the through-hole 20a of the stage 20. When the thickness of the stage 20 is 15 to 25 mm, the formation position of the lateral hole 20d, or the like is for example as follows. However, they are not limited thereto depending on the formation position of the heater pattern 21, or the like.

Thickness T1 of the small-diameter portion $20a_1$ of the through-hole 20a of the stage 20: 1.5 to 2.5 mm Distance L1 from the small-diameter portion $20a_1$ to the lateral hole 20d in the stage 20: 8 to 12 mm Height H1 of the lateral hole 20d of the stage 20: 2 to 4 mm Length L2 of the protrusion 31 of the lift pin 30: 8 to 13 mm Length L3 of the large diameter portion 32 of the lift pin 30: 1.5 to 2.5 mm Thickness T2 of the support member 70: 1.5 to 2.5 mm The aforementioned dimension is used for the thickness T1 of the small-diameter portion $20a_1$ of the through-hole 20a of the stage 20 in terms of strength. Furthermore, the distance between the peripheral end surface of the stage 20 at the processing position and the inner wall surface of the process vessel 10 is, for example, 100 to 150 mm.

Figure 5:
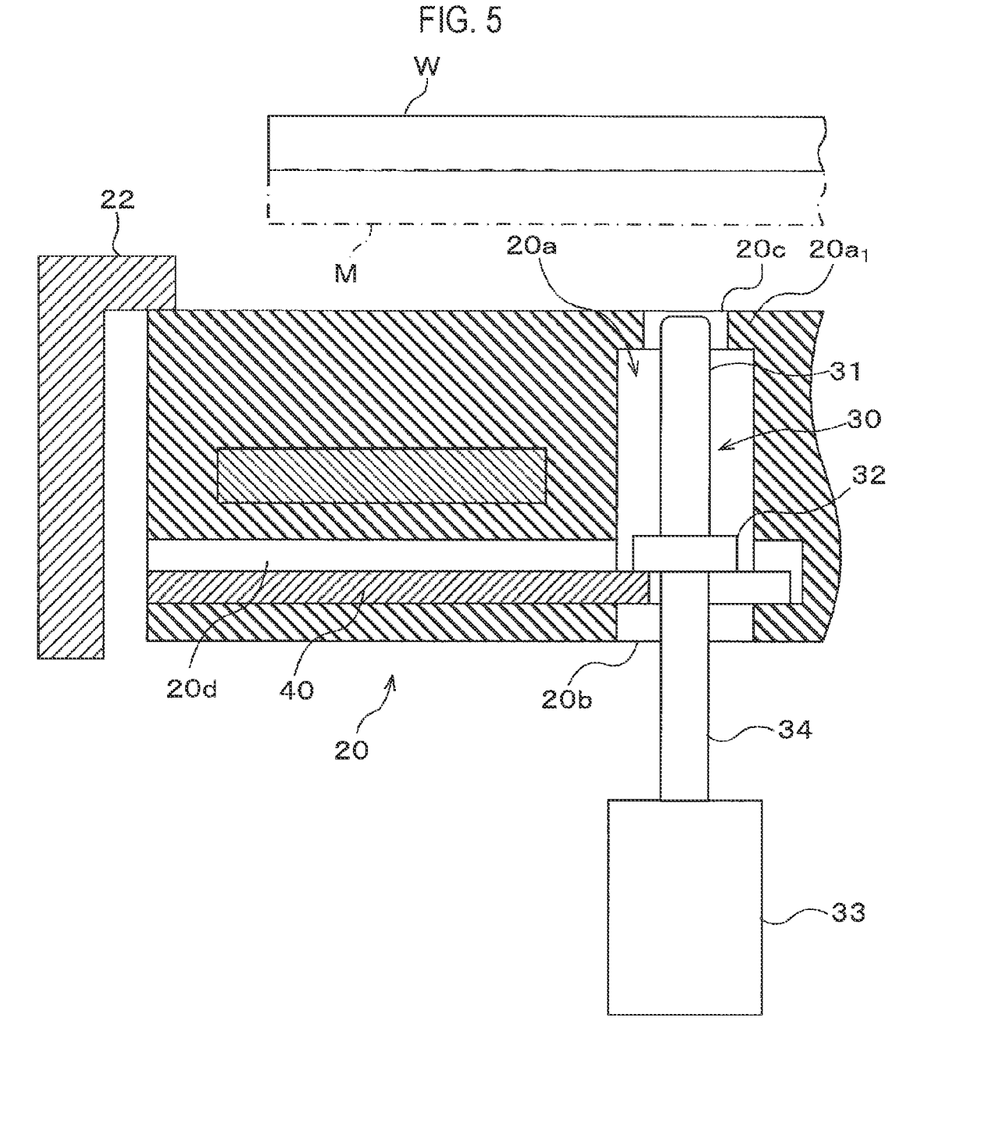
FIG. 5 is a partial enlarged cross-sectional view illustrating an internal state of the film forming apparatus in FIG. 1 during water processing.
Figure 6:
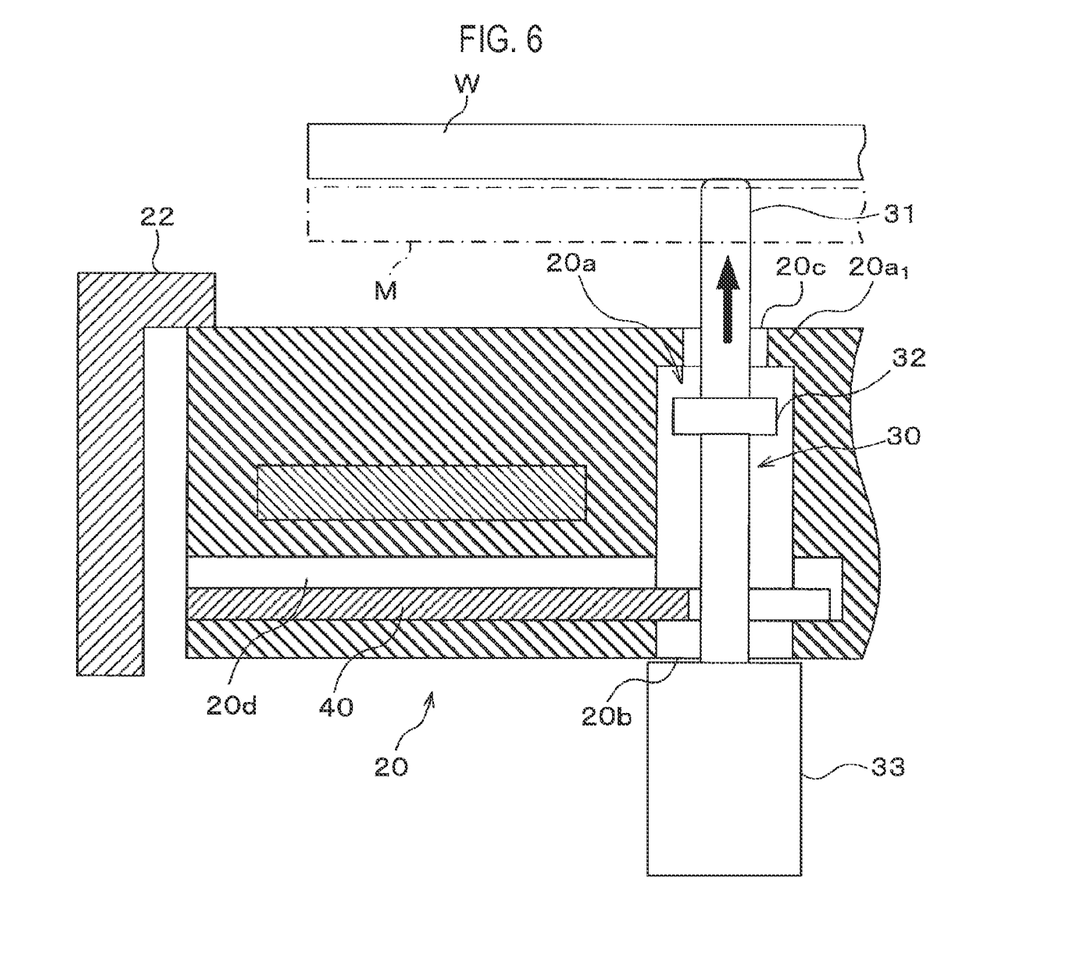
FIG. 6 is a partial enlarged cross-sectional view illustrating an internal state of the film forming apparatus in FIG. 1 during wafer processing.

Next, wafer processing performed using the film forming apparatus 1 will be described. This will be described with reference to FIGS. 1 and 2 and FIGS. 5 and 6. FIGS. 5 and 6 are partial enlarged cross-sectional views illustrating an internal state of the film forming apparatus 1 during the wafer processing.

First, the gate valve 12 is opened, and the wafer W is loaded into the process vessel 10 from a transfer chamber (not shown) in a vacuum atmosphere adjacent to the process vessel 10 via the loading/unloading port 11. The loading of the wafer W is performed by the wafer transfer device M, as illustrated in FIG. 5. The loaded water W is transferred to above the stage 20 moved to the aforementioned standby position. Then, the lift pin 30 suspended by the engagement between the leading end of the support member 70 and the large diameter portion 32 of the lift pin 30 is raised by the pin movement mechanism 100. Thus, as illustrated in FIG. 6, the suspension of the lift pin 30 by the support member 70 is released, and the lift pin 30 protrudes from the upper surface of the stage 20 by a predetermined distance and the wafer W is transferred onto the lift pin 30. In order to increase the amount of protrusion of the lift pin 30 at this time, the lateral hole 20d may be provided in the lower side of the stage 20 as much as possible.

After the wafer W is transferred onto the lift pin 30, the wafer transfer device M is unloaded from the process vessel 10 and the gate valve 12 is closed. At the same time, the lowering of the lift pin 30 by the pin movement mechanism 100 and the raising of the stage 20 by the driving mechanism 24 are performed. Thus, the support of the lift pin 30 by the pin movement mechanism 100 is released, and as illustrated in FIG. 2, the lift pin 30 is again suspended by the support member 70 and the upper end of the lift pin 30 is received in the through-hole 20a of the stage 20, which does not protrude from the upper surface, and the wafer W is placed on the stage 20. Then, the interior of the process vessel 10 is adjusted to a predetermined pressure and the stage 20 is moved to the processing position by the driving mechanism 24 to form the processing space S.

In this state, a $N_2$ gas as a purge gas is supplied to the processing space S via the gas introduction mechanism 50, and a $TiCl_4$ gas and an $NH_3$ gas are alternately and intermittently supplied thereto to form a TiN film on the wafer W by an ALD method. During the film formation, the wafer W is heated on the stage 20 such that the temperature of the wafer W (specifically, the temperature of the stage 20) reaches, for example, 300 to 600 degrees C.

After the formation of the TiN film by the ALD method as described above is completed, the stage 20 on which the wafer W is placed is lowered to the transfer position. Then, the lift pin 30 is raised by the pin movement mechanism 100. Thus, the suspension of the lift pin 30 by the support member 70 is released, the lift pin 30 protrudes from the upper surface of the stage 20 by a predetermined distance, and the wafer W is transferred onto the lift pin 30. Thereafter, the gate valve 12 is opened, and the wafer transfer device M which does not hold the wafer W is inserted into the process vessel 10 via the loading/unloading port 11. The wafer transfer device M is inserted between the wafer W held by the lift pin 30 and the stage 20 at the transfer position. Then, the lift pin 30 is lowered by the pin movement mechanism 100. Thus, the wafer W on the lift pin 30 is transferred to the wafer transfer device M. Then, the wafer transfer device M is unloaded from the process vessel 10 and the gate valve 12 is closed. Consequently, a series of wafer processing is completed. Thereafter, the aforementioned series of wafer processing is performed on another wafer W.

Next, an example of how to provide the lift pin 30 will be described. For example, first, the lift pins 30 are inserted into the respective through-holes 20a of the stage 20 in a turned-over state. Then, the support member 70 is inserted into the lateral hole 20d for each of the through-holes 20a. Thereafter, when the stage 20 which has been turned over is returned, each lift pin 30 is suspended by the support member 70 by engagement between the upper surface of the support member 70 and the lower surface of the large diameter portion 32 of the lift pin 30. Then, the stage 20 is provided in the process vessel 10. Thereafter, the cover member 22 is provided on the upper surface of the stage 20. The provision of the lift pin 30 is performed, for example, in this way.

As described above, in the present embodiment, the film forming apparatus 1 includes the stage 20 having the through-holes 20a vertically penetrating the stage. The wafer W is placed on the upper surface of the stage and is heated. The film forming apparatus 1 further includes the lift pin 30 inserted into the through-hole 20a to be penetrated, and the support member 70 configured to support the lift pin 30. Furthermore, in the present embodiment, the lift pin 30 has the protrusion 31 configured to protrude from the upper surface of the stage 20 through the through-hole 20a of the stage 20, and the large diameter portion 32 located below the protrusion 31 and formed thicker than the protrusion 31. In addition, the stage 20 has the lateral hole 20d which is formed to extend from the side surface of the stage 20 so as to intersect with the through-hole 20a and into which the support member 70 is inserted. Furthermore, in the present embodiment, the lift pin 30 is supported by the engagement of the support member 70 inserted into the stage 20 through the lateral hole 20d and the large diameter portion 32 of the lift pin 30. Eventually, the lift pin 30 is not fixed to the pin movement mechanism 100 or the like. Therefore, the lift pin 30 is not damaged or smooth elevating operation of the lift pin 30 is not impaired by the influence of the thermal expansion or the like of the stage 20. Furthermore, in the present embodiment, the upper opening end 20c of the through-hole 20a of the stage 20 is thinner than the large diameter portion 32 of the lift pin 30 for supporting the lift pin 30. Therefore, according to the present embodiment, since the temperature of the portion of the wafer W corresponding to the through-hole 20a can be suppressed from being lowered compared with, for example, a case where the upper opening end 20c of the through-hole 20a is thicker than the large diameter portion 32 of the lift pin 30, it is possible to improve the in-plane uniformity of the temperature of the wafer W.

Furthermore, according to the present embodiment, it is possible to simply provide the lift pin 30.

Moreover, in the present embodiment, since the member for supporting the lift pin 30, such as the support member 70, does not have a complicated shape and is small in size, it can be manufactured at low cost.

Furthermore, in the present embodiment, since the lift pin 30 is supported by the large diameter portion 32 of the lift pin 30, it is possible to make the diameter of the protrusion 31 of the lift pin 30 as small as possible, and thus to make the dimension of the opening end 20c as small as possible. By making the dimension of the opening end 20c small, it is possible to further improve the in-plane uniformity of the temperature of the wafer W.

Furthermore, in the present embodiment, since at least a portion of the lift pin 30 is always located in the through-hole 20a, a positional deviation between the lift pin 30 and the through-hole 20a does not occur. If the positional deviation occurs, the lift pin may be damaged when the lift pin is raised. However, according to the present embodiment, since the positional deviation does not occur, it is possible to avoid the damage of the lift pin 30. In order to avoid the damage of the lift pin, in particular, in order to avoid the damage of the protrusion of the lift pin, a case where the protrusion of the lift pin is thickened is possible. However, according to the present embodiment, since the damage may not occur as described above, the protrusion of the lift pin needs not to be thickened. That is, it is possible to make the protrusion of the lift pin thin.

In addition, as a technique for improving the in-plane uniformity of the temperature of the wafer W, there is a technique using an edge pin supporting the edge of the wafer W. However, in this technique, since it is necessary to provide an insertion through-hole into which the edge pin is inserted to be penetrated in the stage and the edge of the wafer W is located on the insertion through-hole, a film may also be formed on the rear surface of the wafer. In the present embodiment, such film formation on the rear surface of the wafer does not occur.

In addition, the support structure of the lift pin 30 according to the present embodiment is a simple structure in which the lift pin 30 is suspended by the support member 70, and thus an operating member such as a clamp which may be a discharge source for a foreign matter is not used to support the lift pin 30. Thus, according to the present embodiment, it is possible to prevent deterioration of the quality of a film such as the TiN film formed on the wafer W.

Furthermore, in the present embodiment, the lift pin 30 has, below the large diameter portion 32, the contact portion 33 which is formed thicker than the large diameter portion 32 and with which the pin movement mechanism 100 is brought into contact. Therefore, when the lift pin 30 is moved by bringing the pin movement mechanism 100 into contact with the lift pin 30 from below, the lift pin 30 can be stably supported. Thus, the lift pin 30 is not damaged, such as being broken, as the lift pin 30 rises in an inclined state. Furthermore, by providing the contact portion 33 as described above, the lift pin 30 can be smoothly lowered by its own weight as the contact member 101 of the pin movement mechanism 100 is lowered.

In addition, in the present embodiment, since the connection portion 34 of the lift pin 30 is formed thinner than the large diameter portion 32 as a whole, even if the lift pin 30 is slightly inclined, the connection portion 34 is brought into contact with the lower surface or the like of the stage 20 when the lift pin 30 rises, causing no damage.

Moreover, in the present embodiment, the opening end of the lateral hole 20d of the stage 20 is covered with the cover member 22. Thus, it is possible to prevent the support member 70 from detaching from the lateral hole 20d. By providing the cover member 22, it is possible to prevent unnecessary film formation on the peripheral end surface or the rear surface of the stage 20.

In the aforementioned example, the engagement between the large diameter portion 32 of the lift pin 30 and the support member 70 has not been released only by moving the stage 20 to the transfer position, but has been released when the lift pin 30 is raised by the pin movement mechanism 100. However, in a state where the movement to the transfer position of the stage 20 is completed, the engagement may be released by allowing a further downward movement of the lift pin 30 to be hindered by the contact of the lower surface of the contact portion 33 of the lift pin 30 and the upper surface of the pin movement mechanism 100.

Figure 7:
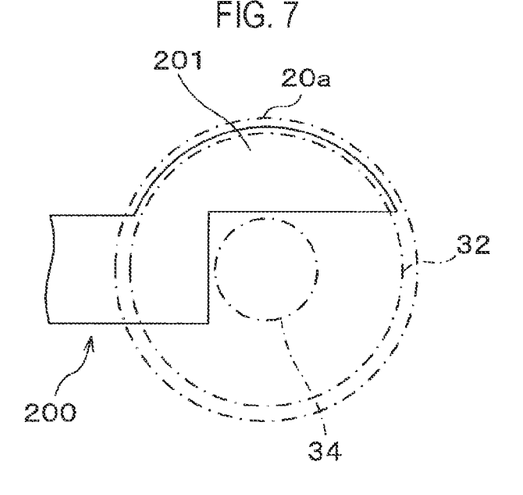
FIG. 7 is a partial enlarged plan view illustrating another example of the support member.

FIG. 7 is a partial enlarged plan view illustrating another example of the support member. In the support member 70 described above with reference to FIG. 3 and the like, the engagement portion 72 provided at its leading end was formed in a U shape. The engagement portion of the support member is not limited to the shape but modification is possible as long as the lift pin 30 can be engaged. Specifically, as long as the large diameter portion 32 of the lift pin 30 can be engaged, the support member may be formed in an L shape, for example, like an engagement portion 201 of the support member 200 in FIG. 7.

Figure 8:
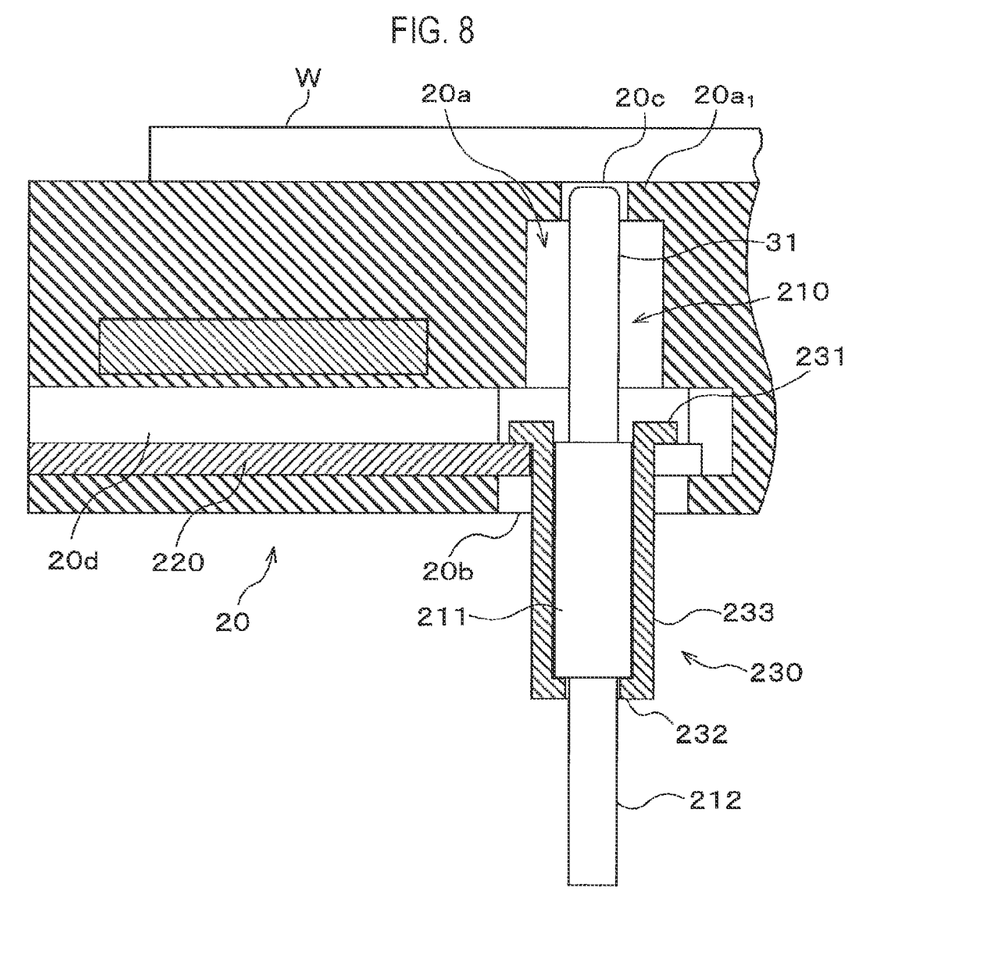
FIG. 8 is a partial enlarged cross-sectional view illustrating another example of a support structure of a lift pin.
Figure 9:
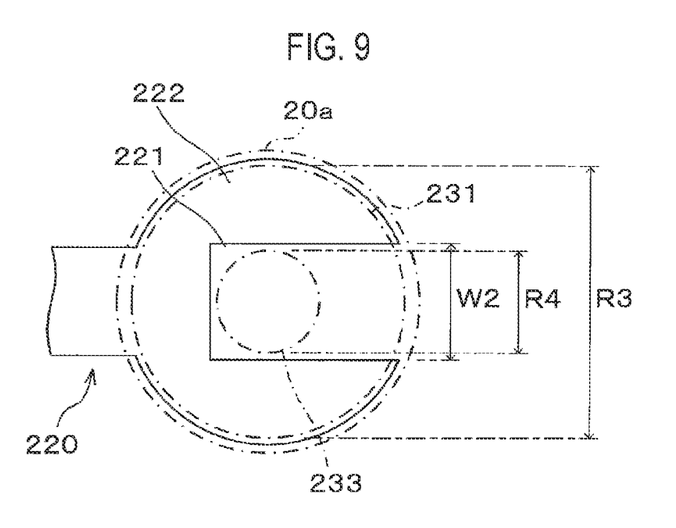
FIG. 9 is an enlarged plan view of a leading end of a support member forming a portion of the support structure of FIG. 8.

Another example of the support structure of the lift pin will be described with reference to FIGS. 8 and 9. FIG. 8 is a partial enlarged cross-sectional view illustrating another example of the support structure of the lift pin, and FIG. 9 is an enlarged plan view of a leading end of the support member forming a portion of the support structure of FIG. 8.

In the aforementioned example, the lift pin 30 engaged with the support member 70 to be supported by the support member 70 such that the lower surface of the large diameter portion 32 of the lift pin 30 and the upper surface of the support member 70 are brought into contact with each other. That is, in the aforementioned example, the lift pin 30 is directly engaged with the support member 70 to be supported by the support member 70.

In contrast, in the example of FIG. 8, a lift pin 210 indirectly engages with a support member 220 inserted into the lateral hole 20d of the stage 20 via a support auxiliary member 230 to be supported by the support member 220 by the indirect engagement.

The support auxiliary member 230 is made of, for example, alumina or aluminum nitride, and has a first engagement portion 231 and a second engagement portion 232. The first engagement portion 231 engages with the support member 220 inserted into the lateral hole 20d of the stage 20. Specifically, the first engagement portion 231 engages with the support member 220 such that the lower surface of the first engagement portion 231 and the upper surface of an engagement portion 222, which will be described later, formed at the leading end of the support member 220 are brought into contact with each other. The second engagement portion 232 is located below the support member 220 inserted into the lateral hole 20d of the stage 20, and engages with a large diameter portion 211 of the lift pin 210. Specifically, the second engagement portion 232 is located below the support member 220, and engages with the lift pin 210 such that the upper surface of the second engagement portion 232 and the lower surface of the large diameter portion 211 of the lift pin 210 are brought into contact with each other.

Furthermore, the support auxiliary member 230 is formed so that a cylindrical portion 233 accommodating the large diameter portion 211 of the lift pin 210 connects the first engagement portion 231 and the second engagement portion 232. The cylindrical portion 233 is formed in, for example, a cylindrical shape whose inner diameter is larger than the large diameter portion 211 of the lift pin 210. In this example, the first engagement portion 231 is formed in an annular shape so as to protrude outward from the outer peripheral surface of the cylindrical portion 233, and the second engagement portion 232 is formed in an annular shape so as to protrude inward from the inner peripheral surface of the cylindrical portion 233.

The support member 220 supports the lift pin 210 by the engagement with the large diameter portion 211 of the lift pin 210 via the support auxiliary member 230 while it is inserted into the lateral hole 20d of the stage 20. Specifically, the support member 220 suspends the lift pin 210 by suspending the support auxiliary member 230, which suspends the lift pin 210 by the engagement with the large diameter portion 211 of the lift pin 210, through the engagement with the first engagement portion 231 of the support auxiliary member 230.

Furthermore, as illustrated in FIG. 9, a notch 221 is formed at a leading end of the support member 220, and a U-shaped engagement portion 222 in which the lift pin 210 is engaged with the notch 221 is formed. The notch 221 is cut in the insertion direction of the support member 220 into the lateral hole 20d of the stage 20, A width W2 of the notch 221 is smaller than a diameter R3 of the first engagement portion 231 of the support auxiliary member 230 and larger than a diameter R4 of the cylindrical portion 233 of the support auxiliary member 230. Therefore, when the support member 220 is inserted to the inner side of the lateral hole 20d of the stage 20, the insertion is not hindered by the support auxiliary member 230 in the through-hole 20a, and the support auxiliary member 230 can be suspended by the substantially entire engagement portion 222 of the support member 220.

Furthermore, in this example, the lower opening end 20b of the through-hole 20a of the stage 20 is formed thicker than the first engagement portion 231 of the support auxiliary member 230. Therefore, a portion of the support auxiliary member 230 on the first engagement portion 231 side can be inserted into the through-hole 20a of the stage 20 from below.

Also, in this example, the upper opening end 20c of the through-hole 20a of the stage 20 is thinner than the large diameter portion 211 of the lift pin 210. Therefore, since the temperature of the portion of the wafer W corresponding to the through-hole 20a can be suppressed from being lowered, it is possible to improve the in-plane uniformity of the temperature of the wafer W.

In addition, the lateral hole 20d of the stage 20 into which the support member 220 is inserted cannot be formed at a position at which the heater pattern 21 is arranged. Therefore, the formation position of the lateral hole 20d cannot be freely set. However, in this example, since the second engagement portion 232 of the support auxiliary member 230 is located below the support member 220, the distance from the leading end of the lift pin 210 to the lower surface of the large diameter portion 211 can be set to a desired value regardless of the formation position of the lateral hole 20d. Thus, it is possible to protrude the lift pin 210 from the upper surface of the stage 20 by a desired amount regardless of the formation position of the lateral hole 20d.

Moreover, in the example of FIG. 3 and the like, the contact portion 33 is formed on the lift pin 30 so as to prevent the lift pin 30 from being moved by the pin movement mechanism 100 in an inclined state. In contrast, in this example, the lift pin 210 does not have the contact portion 33, and instead, the cylindrical portion 233 accommodating the large diameter portion 211 of the lift pin 210 is provided in the support auxiliary member 230. In this configuration, the inclination of the lift pin 210 is limited by the contact of the outer peripheral surface of the lift pin 210 and the inner peripheral surface of the cylindrical portion 233. Thus, in this example, it is possible to prevent the lift pin 210 from being moved by the pin movement mechanism 100 in an inclined state.

The lengths of the large diameter portion 211 of the lift pin 210 and the cylindrical portion 233 of the support auxiliary member 230 are set at least such that the large diameter portion 211 is located inside the cylindrical portion 233 even when the lift pin 210 is maximally raised. Furthermore, the length and outer diameter of the large diameter portion 211 and the length and inner diameter of the cylindrical portion 233 are set such that the lift pin 210 is not brought into contact with the inner peripheral surface of the through-hole 20a even when the lift pin 210 is maximally inclined. In addition, the length of the large diameter portion 211 is, for example, 10 to 15 mm, and the length of the cylindrical portion 233 is, for example, 15 to 25 mm.

In the aforementioned example, the lateral hole 20d of the stage 20 extended in the horizontal direction, namely extended in a direction parallel to the upper surface of the stage 20, but the lateral hole 20d may be formed so as to be inclined with respect to the upper surface of the stage 20 and so as to extend obliquely downward from the side surface of the stage 20. In this case, the cover member 22 may be omitted.

Furthermore, although the film formation performed by the ALD method has been described above, the technique according to the present disclosure may also be applied to a case where the film formation is performed by a CVD method. For example, the technique according to the present disclosure may also be applied to a case where a Si film or a SiN film is formed by a CVD method using a Si-containing gas.

Although the film forming apparatus has been described as an example in the foregoing example, the technique according to the present disclosure may also be applied to a substrate processing apparatus which has a stage and performs any process other than the film forming process. For example, it may also be applied to an inspection device which performs an inspection process, or to an etching device.

According to the present disclosure in some embodiments, it is possible to improve in-plane uniformity of a temperature of a substrate when the substrate placed on a stage having a through-hole into which a substrate support pin is inserted is heated or cooled on the stage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for processing a substrate, comprising:
   a stage including a through-hole vertically penetrating the stage, the substrate being placed on an upper surface of the stage, and at least one of heating and cooling being performed on the substrate;
   a substrate support pin inserted into the through-hole; and
   a support member configured to support the substrate support pin,
   wherein the substrate support pin has a protrusion configured to protrude from the upper surface of the stage through the through-hole of the stage, and a large diameter portion located below the protrusion and formed thicker than the protrusion, and
   the stage further includes a lateral hole formed to extend from a side surface of the stage so as to intersect with the through-hole, and
   the support member is inserted into the lateral hole,
   the support member is configured to support the substrate support pin by an engagement with the large diameter portion of the substrate support pin while the support member is inserted into the lateral hole of the stage, and
   an upper opening end of the through-hole of the stage is thinner than the large diameter portion of the substrate support pin.

2. The substrate processing apparatus of claim 1, wherein the support member is configured to support the substrate support pin by an engagement of an upper surface of the support member with a lower surface of the large diameter portion while the support member is inserted into the lateral hole of the stage.

3. The substrate processing apparatus of claim 2, further comprising a pin movement mechanism having a contact member movable up and down below the stage to vertically move the substrate support pin,
   wherein the substrate support pin includes a contact portion below the large diameter portion, the contact portion being formed thicker than the large diameter portion and making contact with the pin movement mechanism.

4. The substrate processing apparatus of claim 3, further comprising a cover member configured to cover opening ends of the lateral hole of the stage.

5. The substrate processing apparatus of claim 4, wherein the support member includes a notch cut in a direction in which the support member is inserted into the lateral hole.

6. The substrate processing apparatus of claim 1, further comprising a support auxiliary member having a first engagement portion configured to engage with the support member inserted into the lateral hole of the stage, and a second engagement portion located below the support member inserted into the lateral hole of the stage and configured to engage with the large diameter portion of the substrate support pin, wherein the support member is configured to support the substrate support pin by an engagement with the large diameter portion via the support auxiliary member while the support member is inserted into the lateral hole.

7. The substrate processing apparatus of claim 6, wherein the support auxiliary member is formed so that a cylindrical portion accommodating the large diameter portion of the substrate support pin connects the first engagement portion with the second engagement portion.

8. The substrate processing apparatus of claim 1, further comprising a cover member configured to cover opening ends of the lateral hole of the stage.

9. The substrate processing apparatus of claim 1, wherein the support member includes a notch cut in a direction in which the support member is inserted into the lateral hole.

10. A stage having an upper surface on which a substrate is placed, the stage comprising:

a temperature adjuster configured to perform at least one of heating and cooling to the substrate placed on the upper surface;

a through-hole vertically penetrating the stage; and a lateral hole formed to extend from a side surface of the stage so as to intersect with the through-hole, wherein a substrate support pin having a protrusion configured to protrude from the upper surface of the stage through the through-hole, and a large diameter portion located below the protrusion and formed thicker than the protrusion is inserted into the through-hole, a support member is configured to engage with the large diameter portion of the substrate support pin to support the substrate support pin, and is inserted into the lateral hole, and an upper opening end of the through-hole is thinner than the large diameter portion of the substrate support pin.

* * * * *